United States Patent
Kimura et al.

(10) Patent No.: US 7,805,121 B2
(45) Date of Patent: Sep. 28, 2010

(54) RADIO SIGNAL RECEIVER AND GAIN CONTROL METHOD THEREOF

(75) Inventors: Dai Kimura, Kawasaki (JP); Hiroyuki Seki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 660 days.

(21) Appl. No.: 11/797,281

(22) Filed: May 2, 2007

(65) Prior Publication Data
US 2008/0048903 A1 Feb. 28, 2008

(30) Foreign Application Priority Data
Aug. 23, 2006 (JP) ............................. 2006-226256

(51) Int. Cl.
*H04B 1/06* (2006.01)
(52) U.S. Cl. .............. 455/232.1; 455/234.1; 455/234.2; 455/247.1; 455/250.1; 375/345; 375/142
(58) Field of Classification Search .............. 455/232.1, 455/234.1, 234.2, 247.1, 250.1; 375/345, 375/142
See application file for complete search history.

(56) References Cited

U.S. PATENT DOCUMENTS 7,415,083 B2 * 8/2008 Anderson .................. 375/345
7,421,250 B2 * 9/2008 Shi .............................. 455/73
7,457,617 B2 * 11/2008 Adams et al. ................ 455/418
2008/0160945 A1 * 7/2008 Crinon et al. ............. 455/234.1

FOREIGN PATENT DOCUMENTS

| EP | 1 067 697 A1 | 1/2001 |
|---|---|---|
| JP | 07143025 | 6/1995 |
| JP | 2006/135617 | 5/2006 |
| WO | WO 99/39446 | 8/1999 |
| WO | WO 2006/049253 | 5/2006 |

OTHER PUBLICATIONS

Extended European search report, Nov. 26, 2007, Application No. 07106907.4-2215, Reference No. P108405EP00/DNL, 8 pgs.

* cited by examiner

*Primary Examiner*—Sanh D Phu
(74) *Attorney, Agent, or Firm*—Myers Wolin, LLC

(57) ABSTRACT

A radio signal receiver in which a RF-receiving unit 12 converts a radio received signal to a baseband signal, an AD-conversion unit 15a, 15b converts that baseband received signal to a digital signal, and a baseband-processing unit 16 uses the digital signal to perform specified baseband processing, and in which an average-interference-level-measurement unit (SIR measurement unit) 17 measures the average interference level of the received signal, an amp-gain-adjustment unit 18 sets the gain so that a fixed binary value becomes that measured average interference level, and a variable-gain amp 14a, 14b controls the reception level of the received signal by that set gain.

9 Claims, 8 Drawing Sheets

RADIO SIGNAL RECEIVER AND GAIN CONTROL METHOD THEREOF

BACKGROUND OF THE INVENTION

This invention relates to a radio signal receiver that receives radio signals and to the gain-control method thereof, and more particularly, to a radio signal receiver and gain-control method thereof that converts a radio received signal to a baseband received signal, and converts that baseband received signal to a digital signal, and performs specified baseband processing based on that digital signal.

A radio signal receiver receives a radio signal from an antenna, and after converting that received signal to a baseband signal, converts the baseband signal to a digital signal, and performs baseband processing such as demodulation, reception-quality measurement, channel estimation/compensation, error-correction and decoding of that digital signal. FIG. 7 is a drawing showing the construction of a prior radio signal receiver. A radio signal is received by way of an antenna and input to a RF-receiving unit 2. The RF-receiving unit 2 comprises: a high-frequency amplifier 2a; a bandpass filter 2b that restricts the bandwidth, and a frequency-conversion unit 2c that performs frequency conversion processing of the RF signal and converts this RF signal to a baseband signal. An orthogonal-wave-detection unit 3 performs orthogonal-wave detection on the received baseband signal, and outputs two orthogonal signal components I, Q that are orthogonal to each other, variable-gain amplifiers (amps) 4a, 4b amplify the orthogonal signal components I, Q, respectively, and input the results to AD-conversion units 5a, 5b, where those AD-conversion units 5a, 5b convert the input analog received signals to digital signals and input those signals to a baseband-processing unit 6 and average-level-measurement unit 7. The baseband-processing unit 6 performs the aforementioned processing, and the average-level-measurement unit 7 calculates the power from $I^2+Q^2$, and outputs the average value over a specified period. An amp-gain-adjustment unit 8 sets the gain so that the level of the input to the baseband-processing unit is constant, and inputs the result to the amps 4a, 4b. The average-level-measurement unit 7 and amp-gain-adjustment unit 8 form an auto-gain-control unit (AGC circuit) 9.

As described above, the prior AGC (Automatic Gain Control) circuit 9 generally measures the reception power after AD conversion, and controls the gain of the amps 4a, 4b based on the result. However, with this construction, it is difficult to handle reception of a burst signal that occurs in packet communication. Here, reception of a burst signal includes burst-like changes in the reception level as a result of adaptive-modulation control or scheduling control.

FIG. 8 is a drawing that explains conventional automatic gain control. When there is a low incoming signal, the average level of the incoming signal becomes low and is expressed by 'b' bits. At this time, assuming that the upper limit is larger than the average reception level by the level corresponding to 'a', bits, the width of the range of the low incoming signal becomes (a+b) bits. On the other hand, when there is a high incoming signal, the average level becomes high and is expressed by (b+c) bits. Here, 'c' bits is the difference between the average level of the high incoming signal and the average level of the low incoming signal. When the incoming signal is a high incoming signal, assuming that the upper limit is larger than the average reception level by the level corresponding to 'a' bits, the width of the range of the high incoming signal becomes (a+b) bits.

In this conventional automatic gain control, the average reception level is measured after AD conversion, and the gain of the amp is controlled so that the average level corresponds to 'b' bits. For example, the gain of the amp is controlled so that the binary value of "b" bits each of which is "1" becomes the measured average level. By performing AGC in this way, when there is a high incoming signal and when there is a low incoming signal the width of the range is (a+b) bits, so it is sufficient that the number of output bits of the AD-conversion units 5a, 5b is (a+b) bits.

However, there is a difference (maximum of 'c' bits) between the average level of a high incoming signal and low incoming signal. Due to this difference, when the average level of the incoming signal becomes low by reception of a burst signal during period of a high incoming signal, or when the average level of the incoming signal becomes high by reception of a burst signal during period of a low incoming signal, the reception level greatly changes from the average level of 'b' bits, and this becomes a problem. That problem will be explained below.

As shown in (A) of FIG. 9, in order to cope with the case where the average level of the incoming signal becomes low by reception of a burst signal during period of a high incoming signal, it is necessary to increase the average level to the level of (b+c) bits. In other words, it is necessary to make the average level be level of (b+c) bits and make the upper level limit be a level 'a' bits higher than the average level. On the other hand, as shown in (B) of FIG. 9, in order to cope with the case where the average level of the incoming signal becomes high by reception of a burst signal during period of a low incoming signal, it is necessary to make the average level be the level of 'b' bits, and make the upper level limit (a+c) bits higher than the average level.

The receiver does not know whether the receiving state is in a high-incoming-signal state, or in a low-incoming-signal state. Therefore, in order to correspond to both of the aforementioned states, or in other words, in order to express the level of the received signal without distortion, it is necessary to specify a high level of (a+c) bits as the upper limit level when the maximum average level is a level of (b+c) bits. As a result, it is necessary that the total number of bits output from the AD-conversion units 5a, 5b be (a+c)+(b+c) bits, or in other words, a large (a+b+2c) bits.

From the above, when taking into consideration reception of a burst signal, the necessary number of bits for the AD-conversion units becomes large. As the necessary number of bits for the AD-conversion units becomes large, there is a problem in that the operation speed decreases, and hardware becomes large. Also, there is a limit on the maximum number of bits for AD-conversion units, and as the number of bits (a+b+2c) becomes larger, there is a possibility that there will be no AD-conversion unit that can satisfy that number of bits.

Various prior AGC circuits have been proposed (for example, see JP2006-135617A), however, no AGC circuit has been proposed that decreases the number of bits required for the AD-conversion units even when a burst signal is received.

SUMMARY OF THE INVENTION

Taking the above into consideration, it is the object of the present invention to make it possible to decrease the number of bits required for the AD-conversion units even when a burst signal is received.

Another object of the present invention is to make it possible to reduce the number of data bits input to the baseband-processing unit even when a burst signal is received.

A first aspect of the invention is, a radio signal receiver that receives a radio signal, comprising: an AD-conversion unit that converts a received signal to a digital signal, a processing unit that performs specified processing based on the digital signal and a gain-control unit that controls the level of the received signal wherein the gain-control unit, includes an average-interference-level-measurement unit that measures the average interference level of the received signal, a gain-adjustment unit that adjusts the gain so that a fixed binary value becomes the measured average interference level and a received-signal-level-control unit that controls the level of the received signal by the adjusted gain.

The received-signal-level-control unit is a variable-gain amplifier to which the analog received signal is input, and that controls the level of the received signal by the adjusted gain and inputs the result to the AD-conversion unit. Alternatively the received-signal-level-control unit is a multiplier to which the digital received signal is input from the AD-conversion unit, and that multiplies the received signal by the adjusted gain.

A second aspect of the invention is a gain-control method for a radio signal receiver that converts a radio received signal to a baseband received signal, converts that baseband received signal to a digital signal, and performs specified baseband processing based on the digital signal, comprising a step of measuring the average interference level of the received signal, a step of setting gain so that a fixed binary value becomes the measured average interference level and a step of controlling the reception level of the received signal by that set gain.

The gain-control method further comprises a step of performing AD conversion of the analog received signal, of which level is controlled, and inputting the result to a baseband-processing unit. Alternatively the gain-control method further comprises a step of converting the analog received signal to a digital signal, then multiplying that digital received signal by the gain to control the reception level of the received signal.

With this invention, the average interference level of the received signal is measured, gain is set so that a fixed binary value become that measured average interference level, and the reception level of the received signal is controlled by that set gain, so it is possible to reduce the number of bits required by the AD-conversion unit even when a burst signal is received. As a result, the operation speed is improved, and it is possible to simplify the construction of the baseband-processing unit.

Also, with this invention, an analog received signal is converted to a digital signal, the average interference level of that received signal is measured, gain is set so that a fixed binary value become that measured average interference level, and the reception level of the received signal is controlled by multiplying the digital received signal by that gain, so it is possible to reduce the number of data bits that are input to the baseband-processing unit, it is possible to improve the operation speed and it is possible to simplify the construction of the baseband-processing unit.

Other features and advantages of the preset invention will be apparent from the following description taken in conjunction with the accompanying drawings.

DESCRIPTION OF THE PREFERRED EMBODIMENTS

(A) Theory of the Invention

Figure 1:
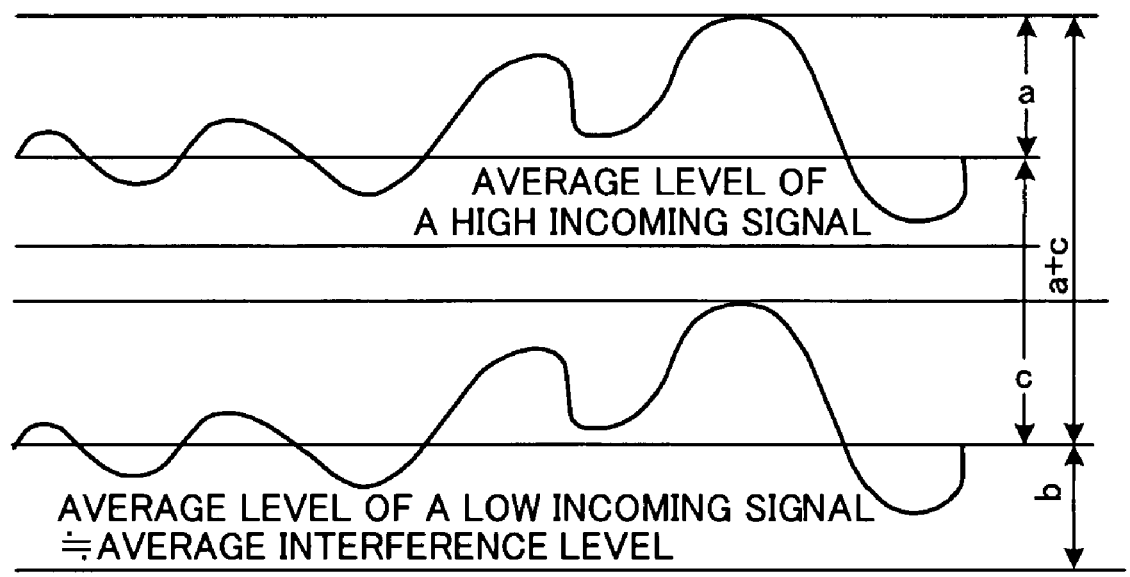
FIG. 1 is a drawing showing the construction of a radio signal receiver of the present invention.

When a low level signal is input, the level of the incoming signal can be considered to be nearly equal to the interference level because the SIR (Signal to Interference Ratio) at the antenna becomes 0 dB or less. Therefore, as shown in FIG. 1, gain of a variable-gain amplifier is controlled so that the interference level corresponds to 'b' bits, or in other words, the interference level is $2^{b-1}$. Also, the number of bits of the AD-conversion units is taken to be (a+b+c) bits. Here, the difference between the average levels of a low incoming signal and a high incoming signal is 'c' bits, and the difference between the upper limit level and average level of a high incoming signal is 'a' bits.

By doing this, when there is a low incoming signal, it is possible to make the upper limit level (a+c) bits higher than the interference level 'b', and even when the average level of the incoming signal becomes high by reception of a burst signal, the upper limit level can still be adequately expressed as (a+b+c) bits.

On the other hand, when there is a high incoming signal from FIG. 1 the average level becomes the level of (b+c) bits and the number of bits of the AD-conversion units is (a+b+c) bits. Therefore, it is possible to make the upper limit 'a' bits higher than the average value (b+c). In other words, when there is a high incoming signal, it is possible for the AD-conversion units to adequately express level of the received signal by (a+b+c) bits even when the level of the received signal is 'a' bits higher than the average level of (b+c) bits.

As described above, the gain of the variable-gain amplifier is controlled so that the interference level corresponds to 'b' bits, for example, the gain is controlled so that the interference level becomes the binary value of bits each of which is '1', and it is possible to adequately express the level of a received signal by (a+b+c) bits even when a burst signal is received. In other words, it is possible to reduce the (a+b+2c) bits required conventionally as the number of bits output from the AD-conversion units to (a+b+c) bits.

Also, 'b' was explained as being equal for low incoming signals and high incoming signals, however, in actuality, it is different for low incoming signals and high incoming signals, and the required number of bits is equal to the larger of the 'b' values. However, in this invention, it is possible to adopt the smaller 'b' value for a low incoming signal, which has the effect of coping with burst signals, while at the same time further reducing the required number of bits.

(B) First Embodiment

Figure 2:
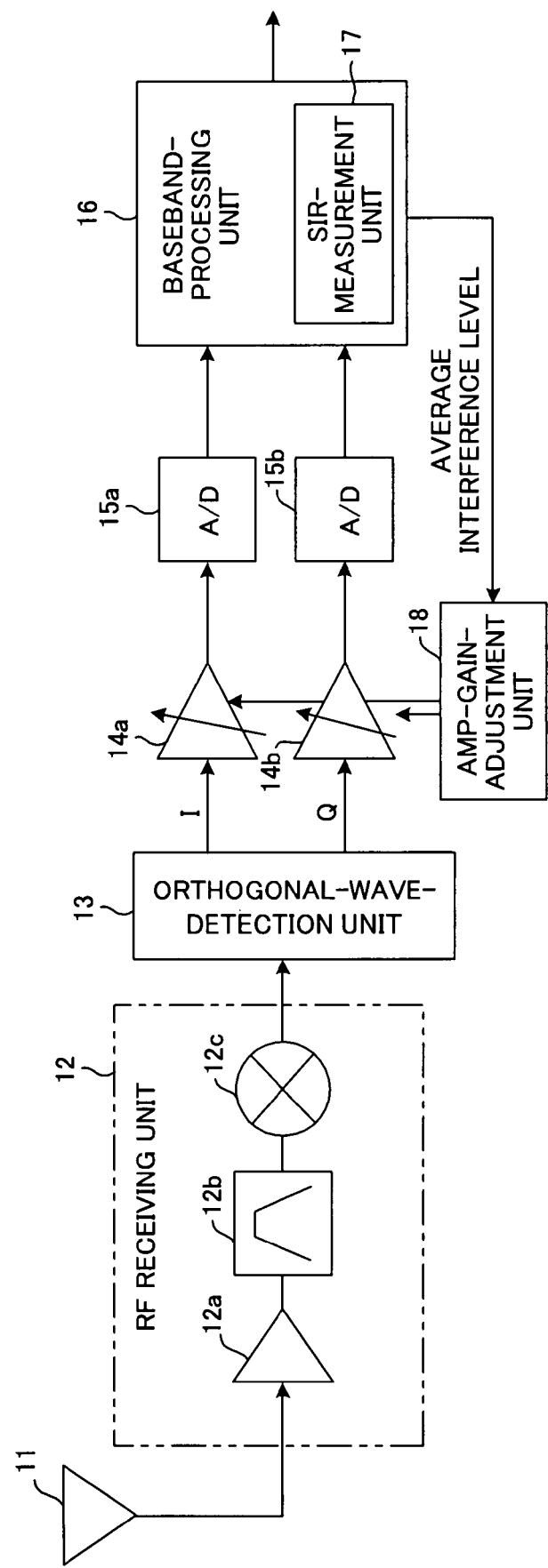
FIG. 2 is a drawing showing the components of a first embodiment of the radio signal receiver.

FIG. 2 is a drawing showing the major components of a first embodiment of a radio signal receiver. A radio signal is received by an antenna 11, and input to an RF-receiving unit 12. The RF-receiving unit 12 comprises: a high-frequency amplifier 12a; a bandpass filter 12b that restricts the bandwidth; and a frequency-conversion unit 12c that performs converts frequency conversion and the RF signal to a baseband signal. An orthogonal-wave-detection unit 13 performs orthogonal-wave detection on the received baseband signal, and outputs orthogonal-signal components I, Q that are orthogonal to each other, then variable-gain amplifiers (amps) 14a, 14b amplify the respective orthogonal-signal components I, Q and input the results to AD-conversion units 15a, 15b, and these AD-conversion units 15a, 15b convert the input received analog signals to digital signals, and input them to a baseband-processing unit 16. The baseband-processing unit 16 performs baseband processing such as reception-quality measurement processing, channel estimation/compensation processing, or error-correction/decoding processing on the input digital signals. SIR is measured as the reception quality, and based on that measurement result, the modulation method and degree of modulation performed for down link transmission is set.

An SIR measurement unit 17 of the baseband-processing unit 16 uses the digital orthogonal-signal components and computes the SIR by calculating the average values for the signal level and interference level for each specified period and outputs the SIR and the average interference level (described later).

The amp-gain-adjustment unit 18 adjusts the gain of the variable-gain amplifiers 14a, 14b so that a fixed binary number, for example, $2^{b+1}-1$, becomes the measured average interference level. Assuming that the gain is 1 when the average interference level is Io, the gain-adjustment unit 18 calculates the gain G from the following equation $$G=Io/I \quad (1)$$

where I denotes an actual average interference level. Then the gain-adjustment unit 18 sets that gain for the variable-gain amplifiers (amps) 14a, 14b. From Equation (1), when the average interference level I becomes greater than Io, the gain becomes less than 1, and when the average interference level I becomes less than Io, the gain becomes greater than 1.

The variable-gain amplifiers (amps) 14a, 14b control the gain based on the set gain G. With the auto-gain control described above the gain can be controlled so that the average interference level corresponds to 'b' bits.

By expressing the average interference level as 'b' bits, the difference between the average level of a low incoming signal and a high incoming signal as 'c' bits, and the difference between the upper-limit level and the average level for a high incoming signal as 'a' bits, and by setting the number of bit for the AD-conversion units 15a, 15b to (a+b+c) bits, it is possible to express the level of a received signal without distortion. In other words, when there is a low incoming signal, it is possible to take the upper limit to be (a+c) bits higher than the average interference level 'b', and thus it is possible to adequately express an incoming signal with (a+b+c) bits even when a burst signal is received. Moreover, when there is a high incoming signal, it is possible for the AD-conversion units to adequately express the level of a received signal even when the level of the received signal is 'a' bits higher than the average level (b+c).

Figure 3:
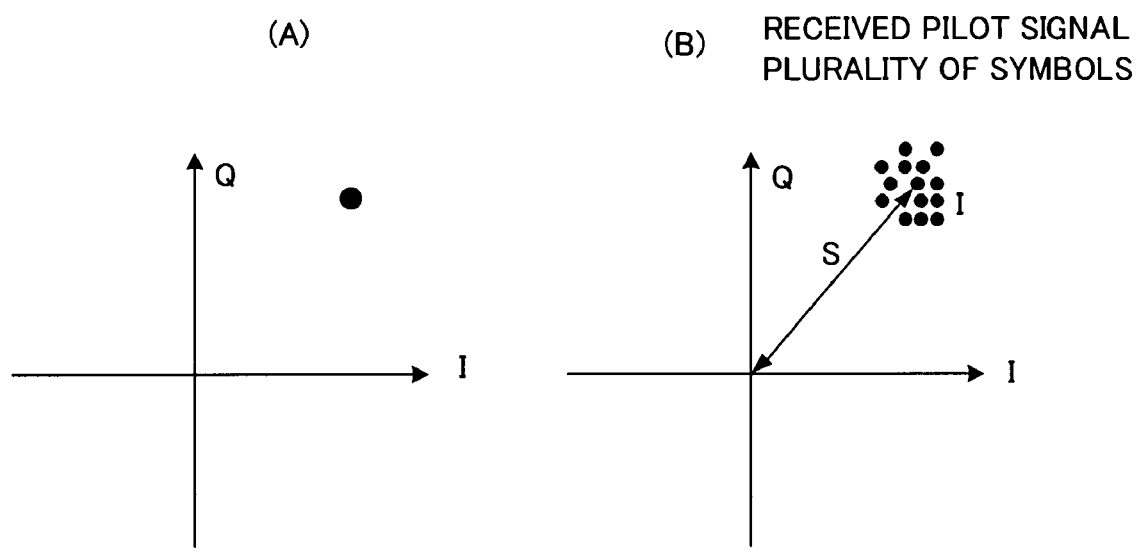
FIG. 3 is a drawing that explains the SIR-measurement method performed by a SIR-measurement unit.

FIG. 3 is a drawing that explains the SIR measurement method for an example of the SIR-measurement unit 17 when CDA communication is assumed. The constellation of the pilot signal on the transmitting side exists at a specified position in the I-Q complex plane as shown in (A) of FIG. 3. However, on the receiving side, the constellation of the received pilot signal is affected by the channel and noise, and is scattered as shown in (B) of FIG. 3. Assuming Code Division Multiple Access (CDMA) system as an example, the average value of the received pilot signal becomes signal component S, the size of the variation from the average becomes the interference component I, and SIR is the ratio of the signal component S and the interference component I.

Therefore, when the de-spread signal of the nth pilot symbol of the kth slot, in the mth path is expressed by rm(n, k), the average value of the de-spread singal can be given by the following equation;

$$\bar{r}_m(k) = \frac{1}{Np} \sum_{n=1}^{Np} r_m(n, k)$$

where Np is pilot symbol number and $1 \leq m \leq M$ (M is the number of multi paths). Also, the average power of a pilot signal is given by the equation below.

$$\tilde{S}_m(k) = |\bar{r}_m(k)|^2$$

Finding the power (interference power) of the difference between the average value of the pilots and each pilot results in the following equation.

$$\tilde{I}_m(k) = \frac{1}{Np} \sum_{n=1}^{Np} |r_m(n, k) - \bar{r}_m(k)|^2$$

In order to improve accuracy, the slot average of the interference power is found by the equation $$\bar{I}_m(k) = \mu \bar{I}_m(k-1) + (1-\mu)\tilde{I}_m(k) \quad (2)$$

and by calculating the average value of ratio of S and I for each path by the equation $$SIR(k) = 10\log_{10}\left\{\frac{1}{M}\sum_{m=0}^{M}\frac{\tilde{S}_m(k)}{\bar{I}_m(k)}\right\} \quad (3)$$

the SIR for the kth slot is found. By computing the square root of the average interference power of Equation (2), the average interference level is found.

Figure 4:
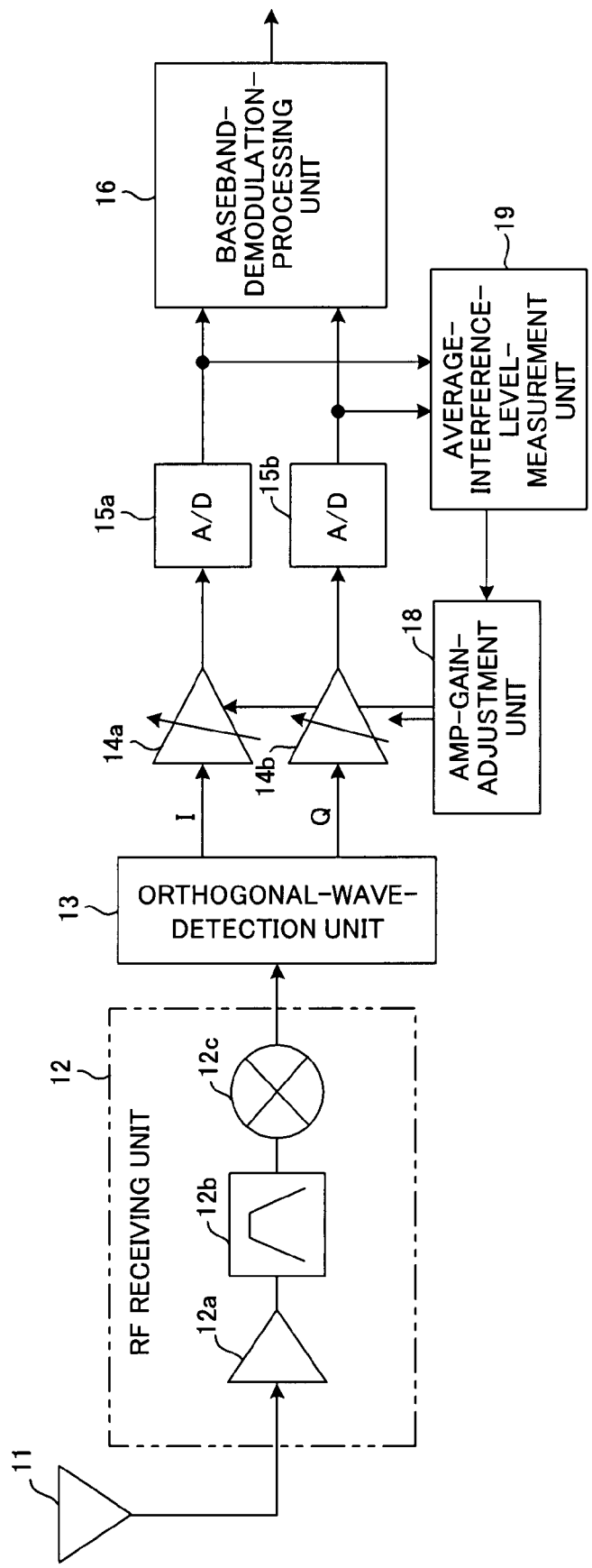
FIG. 4 is a drawing of an example of a variation of the first embodiment.

FIG. 4 is a drawing showing a variation of this first embodiment, where the same reference numbers have been applied to parts that are the same as those of the first embodiment shown in FIG. 2. This variation differs in that there is an average-interference-level-measurement unit 19, and this average-interference-level-measurement unit 19 measures the average interference level according to Equation (2).

(C) Second Embodiment

Figure 5:
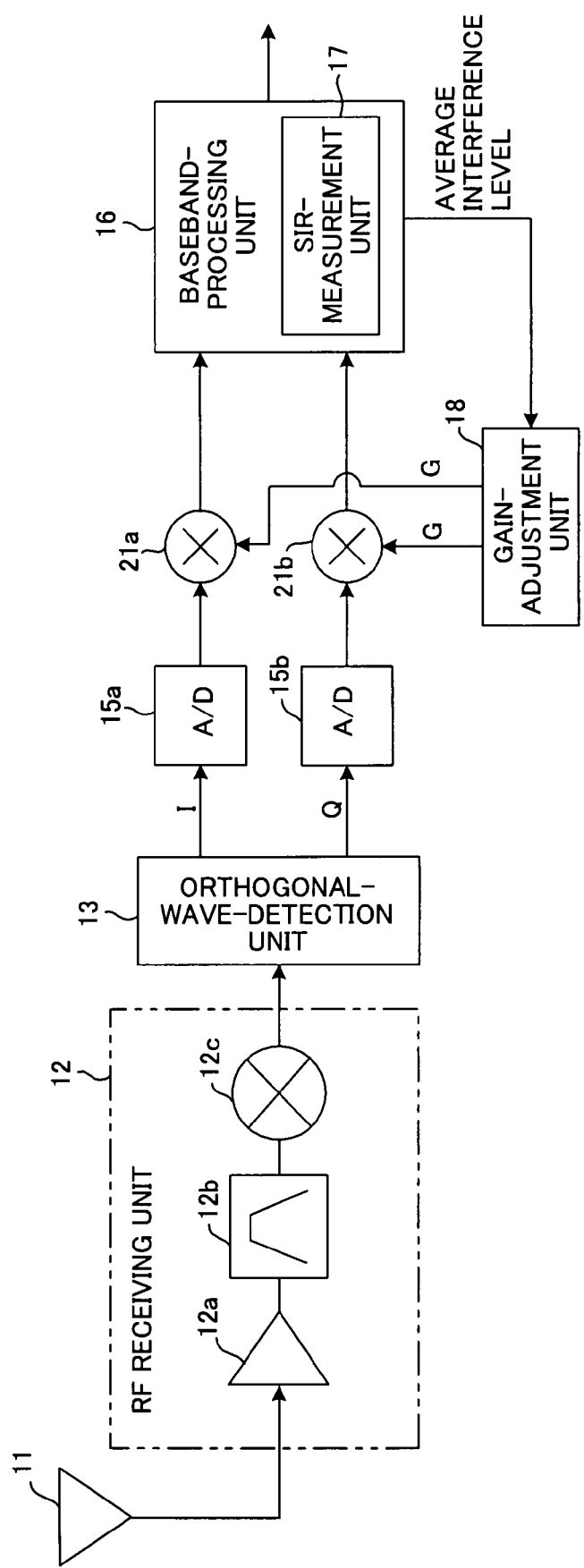
FIG. 5 is a drawing showing the construction of a second embodiment of the radio signal receiver.

FIG. 5 is a drawing showing the construction of a radio signal receiver of a second embodiment of the present invention, in which a digital received signal is multiplied by a gain and then input to a baseband-processing unit.

In the second embodiment shown in FIG. 5, the same reference numbers have been applied to parts that are the same as those of the first embodiment shown in FIG. 2. This embodiment differs in that: (1) AD-conversion units 15a, 15b convert the signal output after orthogonal-wave detection to a digital signal before gain control; (2) digital multipliers 21a, 21b are used instead of the variable-gain amplifiers; and (3) the multipliers 21a, 21b multiply the signals output from the AD-conversion units 15a, 15b by the gain G that was calculated by the gain-adjustment unit 18 to control the reception level of the received signal, and input the results to the baseband-processing unit 16. As in the first embodiment, the gain-adjustment unit 18 sets the gain G so that a fixed binary value, for example, $2^{b+1}-1$, becomes the measured average-interference level, and inputs the result to the multipliers 21a, 21b.

With this second embodiment, the signal output after orthogonal-wave detection is converted to a digital signal, the average interference level of that received signal is measured, and gain is set so that a fixed binary value becomes that measured average interference level, after which the digital received signal is multiplied by that gain to control the reception level of the received signal, so even though it is not possible to reduce the number of output bits of the AD-conversion units, it is possible to reduce the number of data bits input to the baseband-processing unit and improve computation speed, and it is possible to simplify the construction of the baseband-processing unit.

(D) Third Embodiment

The first and second embodiments are embodiments in which the frequency of a radio received signal is converted to a baseband signal, after which AD conversion is performed, however, construction is also possible in which AD conversion is performed in the stage of a high-frequency signal or an intermediate-frequency signal, and then the resulting signal is converted to a baseband signal and automatic gain control performed. By doing this, there is the advantage that AD conversion can be performed by just one AD-conversion unit.

Figure 6:
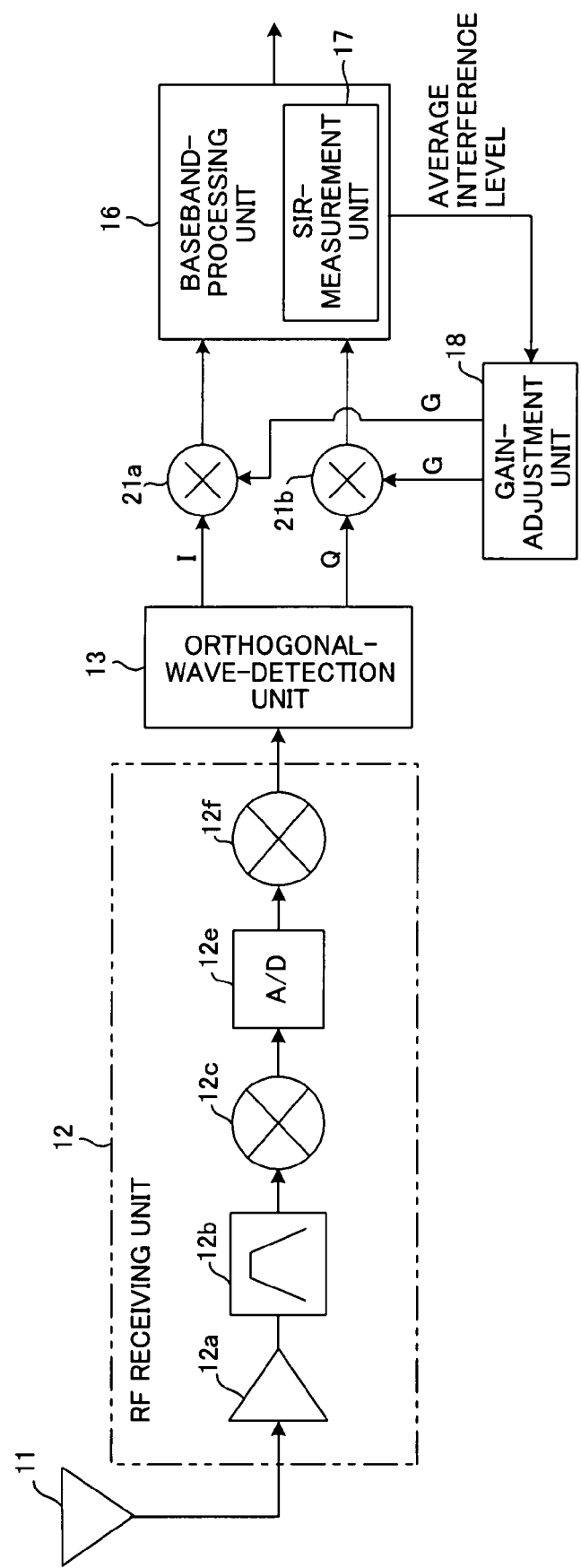
FIG. 6 is a drawing showing the construction of a third embodiment of the radio signal receiver.
Figure 7:
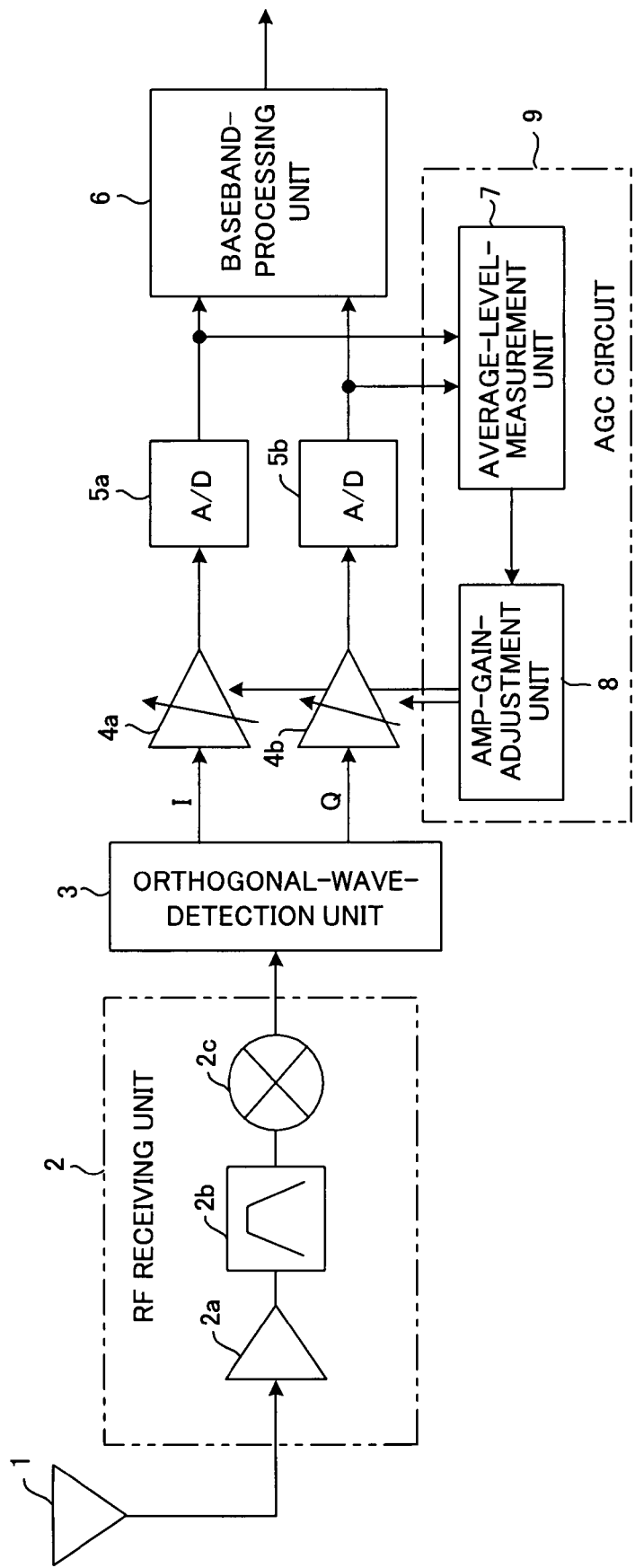
FIG. 7 is a drawing showing the construction of a prior radio signal receiver.
Figure 8:
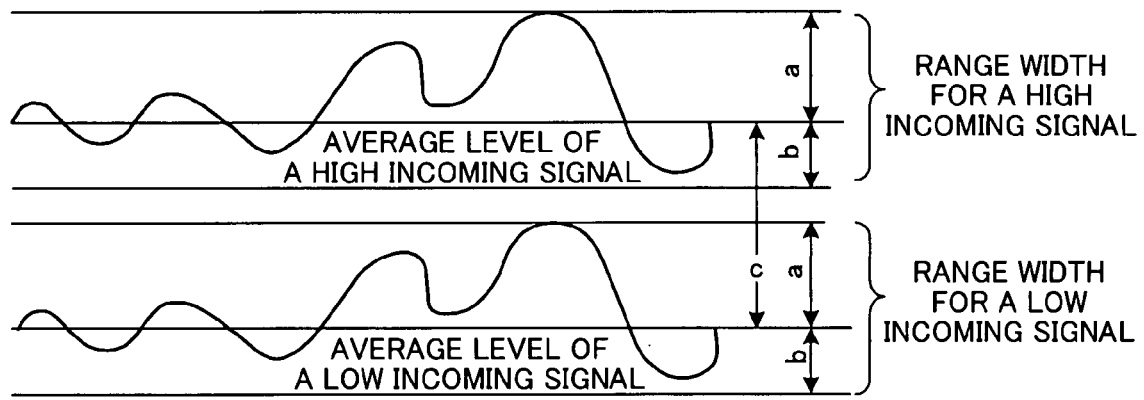
FIG. 8 is a drawing that explains prior automatic gain control (AGC).
Figure 9:
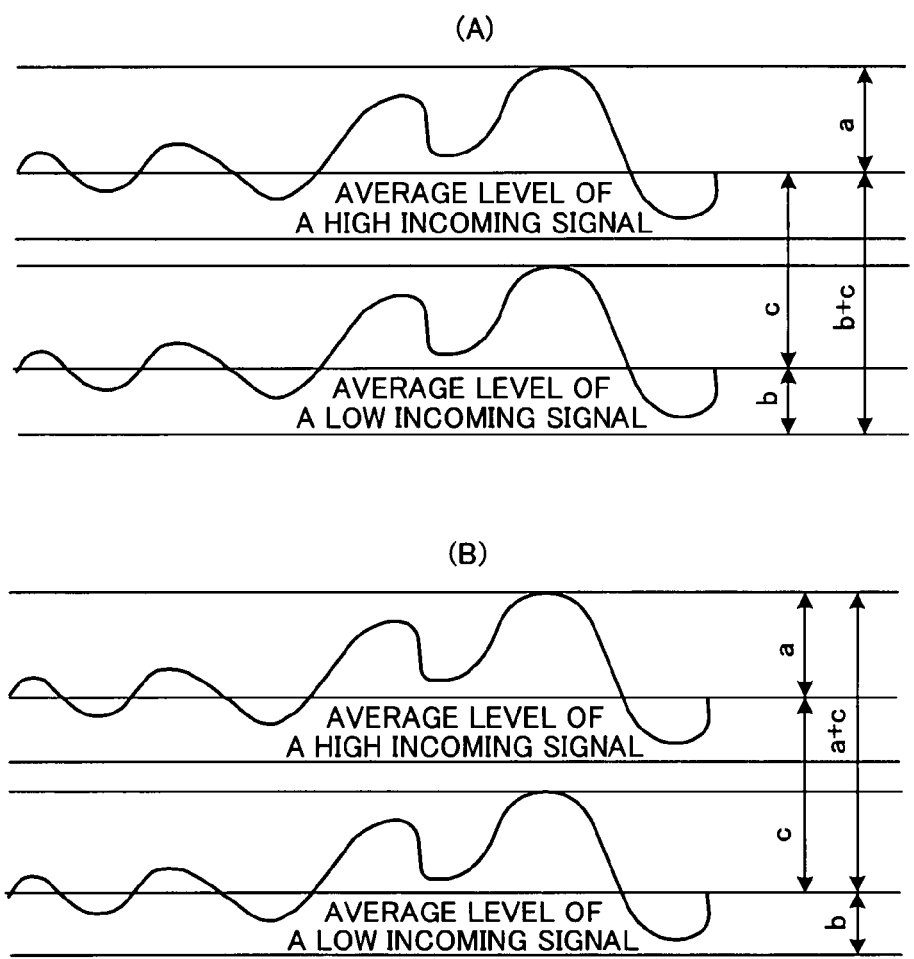
FIG. 9 is a drawing that explains the problem points with the prior automatic gain control (AGC).

FIG. 6 is a drawing showing the construction of this third embodiment of a radio signal receiver, where the same reference numbers have been applied to parts that are the same as those of the second embodiment shown in FIG. 5. This embodiment differs in that: (1) a first frequency-conversion unit 12c converts the frequency of the signal to an intermediate-frequency signal; (2) an AD-conversion unit 12e converts that intermediate-frequency signal from analog to digital; (3) a second frequency-conversion unit 12f converts the frequency of the intermediate-frequency signal to a baseband signal using digital processing; and (4) an orthogonal-wave-detection unit 13 digitally performs orthogonal-wave detection and inputs the orthogonal components I, Q to digital multipliers 21a, 21b. As in the second embodiment, the gain-control unit 18 sets the gain so that a fixed binary value, for example $2^{b+1}-1$, becomes the measured average-interference level, and inputs that gain to the multipliers 21a, 21b.

As many apparently widely different embodiments of the present invention can be made without departing from the spirit and scope thereof, it is to be understood that the invention is not limited to the specific embodiments thereof except as defined in the appended claims.

What is claimed is:

1. A radio signal receiver that receives a radio signal, comprising:
   an AD-conversion unit that converts a received signal to a digital signal;
   a processing unit that performs specified processing based on the digital signal; and
   a gain-control unit that controls the level of said received signal; wherein
   said gain-control unit, includes:
      an average-interference-level-measurement unit that measures the average interference level of the received signal;
      a gain-adjustment unit that adjusts a gain so that a fixed binary value becomes said measured average interference level; and
      a received-signal-level-control unit that controls the level of the received signal by said adjusted gain.

2. The radio signal receiver of claim 1, wherein said received-signal-level-control unit is a variable-gain amplifier to which the analog received signal is input, and that controls the level of the received signal by said adjusted gain and inputs the result to said AD-conversion unit.

3. The radio signal receiver of claim 1, wherein said received-signal-level-control unit is a multiplier to which the digital received signal is input from said AD-conversion unit, and that multiplies the received signal by said adjusted gain.

4. A gain-control method for a radio signal receiver that converts a received radio signal to a baseband signal, converts that baseband signal to a digital signal, and performs specified baseband processing based on the digital signal, comprising:
   measuring the average interference level of the received signal;
   setting gain so that a fixed binary value becomes said measured average interference level; and
   controlling the reception level of the received signal by that set gain.

5. The gain-control method of claim 4, further comprising:
   performing AD conversion of the received signal, of which level is controlled, and inputting the result to a baseband-processing unit.

6. A gain-control method of a radio signal receiver that converts a received radio signal to a baseband signal, converts that baseband received signal to a digital signal, and performs specified baseband processing based on the digital signal, comprising:
   converting the baseband signal to a digital signal;
   setting gain so that a fixed binary value becomes said measured average interference level; and
   multiplying the digital signal by said gain to control the reception level of the received signal.

7. A radio signal receiver that receives a radio signal, comprising:
   a frequency conversion unit that performs frequency conversion and converts the radio signal to a baseband signal;
   an orthogonal-wave-detection unit that performs orthogonal-wave detection of said baseband signal, and outputs two orthogonal-signal components that are orthogonal to each other;

an AD-conversion unit that converts the orthogonal-signal components to digital signals;

a processing unit that performs specified processing based on the digital signals; and a gain-control unit that controls the level of said two orthogonal-signal components; wherein said gain-control unit, includes:

an average-interference-level-measurement unit that uses the digital orthogonal-signal components to calculate and output the average value of the interference level of said baseband signal over each specified period;

a gain-adjustment unit that adjusts a gain so that a fixed binary value becomes said measured average interference level; and a level-control unit that controls the level of said two orthogonal-signal components that are output from said orthogonal-wave-detection unit based on said adjusted gain.

8. The radio signal receiver of claim 7, wherein said level-control unit is a variable-gain amplifier to which the analog orthogonal-signal components are input from said orthogonal-wave-detection unit, and that controls the level of said two orthogonal-signal components by said adjusted gain and inputs the results to said AD-conversion unit.

9. The radio signal receiver of claim 7, wherein said level-control unit is a multiplier to which the digital orthogonal-signal components are input from said AD-conversion unit, and that multiplies the digital orthogonal-signal components by said adjusted gain.

* * * * *